(12) United States Patent
Sutherland

(10) Patent No.: US 6,456,097 B1
(45) Date of Patent: Sep. 24, 2002

(54) FAULT CURRENT DETECTION METHOD

(75) Inventor: Peter E. Sutherland, Voorheesville, NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/474,821

(22) Filed: Dec. 29, 1999

(51) Int. Cl.[7] .................. G01R 27/08; G01R 31/08; G01R 19/00; G01R 1/00

(52) U.S. Cl. ............... 324/713; 324/520; 324/715; 324/107; 324/110; 324/108

(58) Field of Search ................ 324/713, 520, 324/715, 107, 110, 108

(56) References Cited

U.S. PATENT DOCUMENTS

| | | | | |
|---|---|---|---|---|
| 4,331,915 A | * | 5/1982 | Fielden | 324/110 |
| 4,420,721 A | * | 12/1983 | Dorey et al. | 324/110 |
| 4,622,444 A | | 11/1986 | Kandatsu et al. | 200/303 |
| 4,649,455 A | | 3/1987 | Scott | 361/93.3 |
| 4,689,570 A | * | 8/1987 | Ohgaki et al. | 324/418 |
| 4,728,914 A | | 3/1988 | Morris et al. | 335/6 |
| 4,754,247 A | | 6/1988 | Raymont et al. | 335/202 |
| 5,027,091 A | | 6/1991 | Lesslie et al. | 335/132 |
| 5,091,690 A | * | 2/1992 | D'Antonio et al. | 324/107 |
| 5,399,955 A | | 3/1995 | Glaser et al. | 323/208 |
| 5,450,048 A | | 9/1995 | Leger et al. | 335/132 |

(List continued on next page.)

OTHER PUBLICATIONS de Oliveira, A. et al., Practical Approaches for AC System Harmonic Impedance Measurements, IEEE Transactions on Power Delivery, vol. 6, No. 4, Oct. 1991, pp. 1721–1726.

Samesima, M.I. et al., Frequency Response Analysis and Modeling of Measurement Transformers Under Distorted Current and Voltage Supply, IEEE Transactions on Power Delivery, vol. 6, No. 4, Oct. 1991, pp. 1762–1768.

Frankenberg, W. et al., Assessment of Harmonic Interference From Shipborne Converter Equipment for Compliance With Mains Quality Requirements, IEEE Transactions on Power Delivery, vol. 6, No. 4, Oct. 1991, pp. 1735–1739.

Czarnecki, L.S. et al, On–Line Measurement of Equivalent Parameters for Harmonic Frquencies of a Power Distribution System and Load, IEEE Transactions on Instrumentation and Measurement, vol. 45, No. 2, Apr. 1996, pp. 467–472.

Rhode, J.P. et al, Complete Characterization of Utilization-Voltage Power System Impedance Using Wideband Measurement, 1996 IEEE Industrial and Commerical Power Systems Technical Conference Record, pp. 123–130.

Primary Examiner—N. Le
Assistant Examiner—Wasseem H. Hamdan
(74) Attorney, Agent, or Firm—Cantor Colburn LLP

(57) ABSTRACT

A method for measuring the impedance of electrical distribution equipment includes: applying a voltage at a first selected frequency to electrical distribution equipment, waiting a delay time for transient effects to settle, measuring current through the electrical distribution equipment, and selecting additional frequencies to repeat the steps of applying, waiting, and measuring. The method can be implemented, for example, by a meter which includes: a control processor connected to receive and execute instructions, and to output a control signal; a frequency generator for generating a frequency signal having a frequency determined by the control signal; a power amplifier connected to receive the control signal and the frequency signal, the power amplifier outputting a voltage signal to the electrical distribution system through a voltage transformer; and an analog-to-digital converter connected to receive analog feedback voltage signals from the voltage transformer, the analog-to-digital converter outputting a digital feedback voltage signal to the processor.

9 Claims, 3 Drawing Sheets

U.S. PATENT DOCUMENTS

| | | | |
|---|---|---|---|
| 5,450,328 A | | 9/1995 | Janke et al. .................. 702/65 |
| 5,461,300 A | * | 10/1995 | Kappenman ................ 323/215 |
| 5,587,662 A | | 12/1996 | Kelley et al. ............... 324/713 |
| 5,594,748 A | * | 1/1997 | Jabr ........................... 372/38 |
| 5,631,569 A | * | 5/1997 | Moore et al. ............... 324/713 |
| 5,818,245 A | | 10/1998 | Allfather .................... 324/707 |
| 6,208,945 B1 | * | 3/2001 | Koda et al. .................. 702/60 |

* cited by examiner

FAULT CURRENT DETECTION METHOD

BACKGROUND OF THE INVENTION

The present invention relates generally to a method for measuring impedance and other parameters of electrical distribution equipment at harmonic frequencies.

Line impedance forms the basis for many power quality calculations, including voltage sag due to fault and inrush currents, and steady-state line voltage distortion caused by load current distortion. While these calculations have traditionally been performed using the fundamental frequency value of line impedance, it has been recognized as desirable to measure impedance at non-fundamental, or harmonic, frequencies. It is generally advantageous to measure impedance while the power distribution system is energized, as this avoids expensive down time. However, impedance calculations are considerably more difficult in an energized system.

The article by A. W. Kelley et al., "Complete Characterization of Utilization-Voltage Power System Impedance Using Wideband Measurement", 1996 IEEE Industrial and Commercial Power Systems Conference, and U.S. Pat. No. 5,587,662 to Kelley et al. discloses an apparatus which includes a signal source and a power amplifier. The apparatus injects voltage at various frequencies into the power system, and measures the resulting currents. An associated computer plots graphs of resistance and inductance versus frequency. Readings near 60 Hz (and at 180 Hz, and other harmonic frequencies) are inaccurate because the line voltage interferes with measuring the component of the voltage resulting from the injected current. The Kelley article suggests that the values near 60-Hz (and other harmonic frequencies) can be interpolated from the values below 40 Hz and above 80 Hz.

This approach has limitations in accuracy and flexibility. For example, there is often a "resonance point" which will limit the range of values that can be used for interpolation. In other words, the range of frequencies used for interpolation has an upper limit that must be below where resonance effects due to normal system inductance and capacitance become significant.

It would be desirable for a meter to be capable of scanning harmonic frequencies to be used for measurements and to automatically select appropriate frequencies where no interference exists. It would further be desirable for a meter to measure line voltage and to use the line voltage measurement to calculate available Mega Volt-Amperes (MVA). MVA is typically calculated as the product of System Line-Line Voltage in kiloVolts (kV) and Available Symmetrical RMS Fault Current in kiloAmperes (kA)×√3. It would also be desirable for a meter to be usable in three-phase systems.

SUMMARY OF THE INVENTION

The present invention overcomes the above-noted disadvantages of prior devices and methods, and achieves additional advantages, by providing a method for measuring the impedance of electrical distribution equipment. The method comprises applying a voltage at a first selected frequency to electrical distribution equipment, waiting a delay time for transient effects to settle, measuring current through the electrical distribution equipment, and selecting additional frequencies to repeat the steps of applying, waiting, and measuring. The method can be implemented, for example, by a meter which includes: a control processor connected to receive and execute instructions, and to output a control signal; a frequency generator for generating a frequency signal having a frequency determined by the control signal; a power amplifier connected to receive the control signal and the frequency signal, the power amplifier outputting a voltage signal to the electrical distribution system through a voltage transformer; and an analog-to-digital converter connected to receive analog feedback voltage signals from the voltage transformer, the analog-to-digital converter outputting a digital feedback voltage signal to the processor.

The present invention advantageously provides, in a single integrated device, the ability to monitor electrical distribution equipment accurately and reliably.

BRIEF DESCRIPTION OF THE DRAWINGS

The present invention can be understood better by reading the following Detailed Description, which discusses exemplary embodiments of the invention, in conjunction with the accompanying drawings, in which.

DETAILED DESCRIPTION OF THE INVENTION

Figure 1:
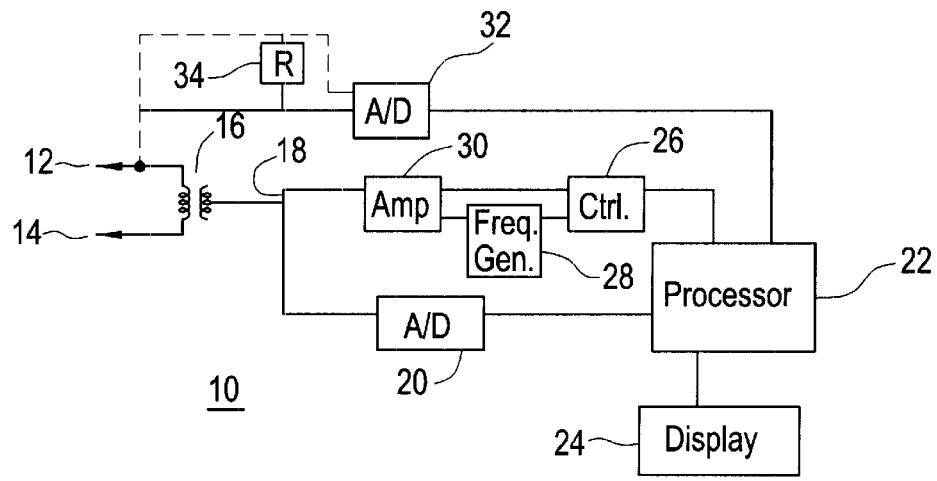
FIG. 1 is a block diagram of an available fault current meter according to one embodiment of the present invention.

Referring now to FIG. 1, a block diagram of a meter according to one implementation of the present invention is shown. The meter 10 includes connection terminals 12 and 14 which are suitable for connection to the electrical distribution system to be monitored (not shown). A voltage transformer 16 is connected between the terminals 12 and 14, and has a secondary winding which provides input to a voltage terminal 18 in the meter 10. The voltage input to the terminal 18 is an analog voltage signal, and this analog voltage signal is converted to a digital voltage signal by analog-to-digital (A/D) converter 20, which is connected to receive analog input from the terminal 18. The A/D converter 20 generates a digital output, and provides this digital output to processor 22 connected to the A/D converter 20. The processor 22 can display an output to a user via a user interface 24 connected to the processor 20. This portion of the diagram, that is, elements 18, 20, 22, and 24, enable the meter to monitor, process, and display to a user voltage feedback from the electrical distribution system.

The user interface 24 can also receive user instructions and provide these instructions to the processor 22, which stores the instructions in its associated memory. Such instructions can include the method which will be described later with respect to FIG. 2. The processor 22 executes instructions based on input from the user (via interface 24) and/or from the voltage feedback from the A/D converter 20, and/or current feedback from the current feedback loop to be described later. Based on one or more of these inputs, the processor 22 outputs a control signal to control module 26.

The control signal can indicate, for example, a magnitude and a frequency of the signal to be applied to the electrical distribution system. Control module 26 provides two outputs, one to a frequency generator 28, and the second to a power amplifier 30. The frequency generator 28 also provides an output to the power amplifier 30. The frequency generator 28 generates a carrier signal at a frequency indicated by the control signal, and provides this carrier signal to the power amplifier 30. The power amplifier 30 amplifies the carrier signal to a magnitude indicated by the control signal from the control module 26, and thereby generates an analog voltage signal to be provided through terminal 18 and the voltage transformer 16 to the electrical distribution system.

The meter of FIG. 1 further includes a current feedback loop. A current transformer 17 is connected between terminal 12 and the voltage transformer 16. The current transformer provides an analog current feedback signal, through a burden resistor 34, to a second analog-to-digital converter 32. The burden resistor 34 is connected to the current transformer in order to convert the signal from a current to a voltage. The A/D converter 32 then converts the analog voltage signal to a digital voltage signal. The AID converter 32 then provides the digital current feedback signal to the processor 22.

In operation, the meter 10: automatically applies an analog voltage signal to the electrical distribution system through the voltage transformer 16 and the terminals 12 and 14; waits for a delay period to allow transient effects of the applied voltage to settle; and then measures the current and voltage conditions (e.g., as represented by the current and voltage feedback signals). This basic process is repeated by applying voltages at different frequencies which are selected by the processor 22 based on, for example, stored instructions, user input, or other suitable basis. The processor 22 can determine the impedance of the electrical distribution system by dividing the root-mean-square (RMS) voltage by the RMS current. The processor 22 can also determine the phase angle between the current and the voltage, and can determine the resistance and inductance of the electrical distribution system at each frequency. The processor 22 can also perform a linear regression, and can perform suitable checks on the quality of the feedback data from the electrical distribution system. If the data is consistent, the processor 22 can continue the analysis of the electrical distribution system (e.g., by incrementing the frequency of the voltage signal to be applied to the system). If the data is not consistent, or is otherwise of poor quality, the processor 22 can terminate the analysis and notify the user via the user interface 24.

From the extrapolated resistance and inductance values for 60 Hz, the complex impedance can be determined, as can the RMS voltage for 60 Hz, the available fault current, apparent power, and ratio of reactance, X, to resistance, R (XR).

Figure 2:
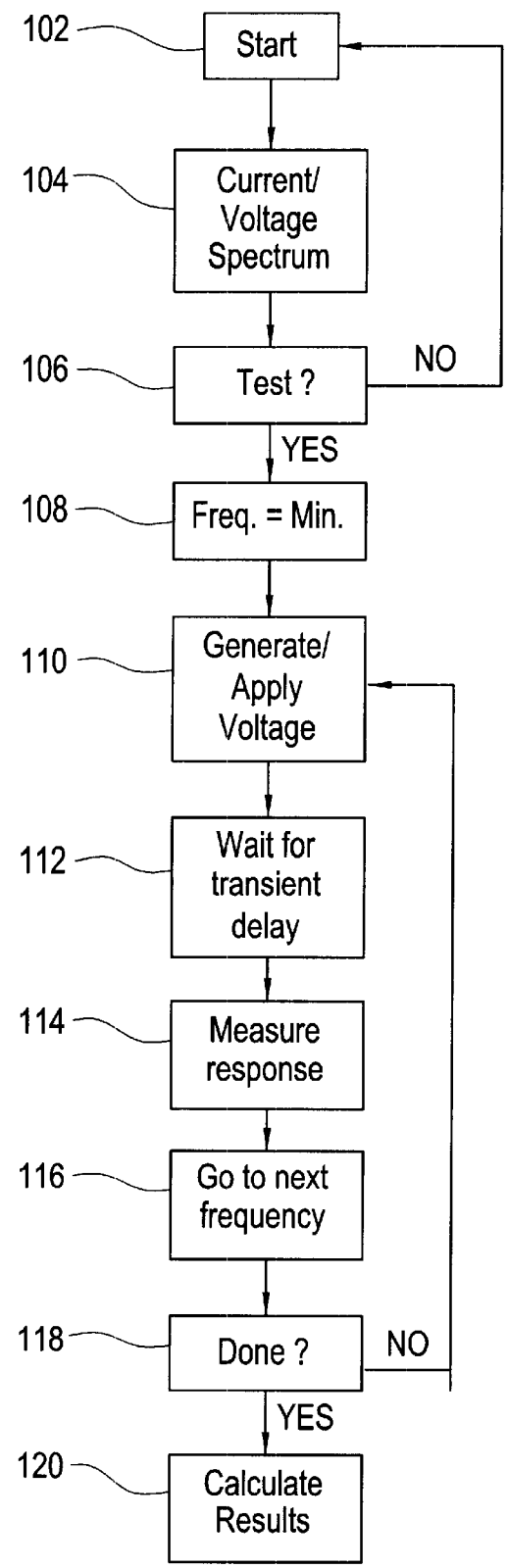
FIG. 2 is a chart showing steps of a method for measuring parameters of electrical distribution equipment according to one embodiment of the present invention.

Referring now to FIG. 2, a flow chart describing a method suitable for implementing the present invention (for example, in the processor 22). The method starts in step 102. Because harmonic voltages and currents may already be present in the power system, errors can be introduced into the measurements. To eliminate such errors, according to one aspect of the present invention, a scan of voltage and current harmonics is performed in step 104, prior to making measurements of the power system. The results of this scan can be used by the meter to prevent the use of frequencies where significant harmonics are present (that is, if the harmonics have a measurable magnitude which exceeds a predetermined threshold). The process continues in step 106, where it is determined whether or not testing is to be performed (e.g., based on user input or based on detection by the processor 22 of predetermined conditions). If no testing is to be performed, the process returns to step 102. If testing is to be performed, the process continues to step 108, where the frequency (e.g., of frequency generator 28, see FIG. 1) is set to a first or minimum value, such as 120 Hz or the second harmonic of a 60 Hz fundamental. If frequencies are to be scanned below the fundamental frequency, the sequence would begin with, for example, 30 Hz, continuing to 15, 7.5 Hz, etc. After the frequency has been set, in step 110, a voltage is generated and applied to the electrical distribution system. In step 112, the process waits for a delay period, which may be of a predetermined duration or a duration calculated from the frequency or other factors. In step 114, after the delay period has expired, the current through the electrical distribution system is measured, and in step 116, the frequency is changed (e.g., incremented to the next resonant frequency). In step 118, it is determined whether the electrical distribution system has been analyzed for all frequencies of interest. This can be performed, for example, by referring to instructions stored in the memory associated with processor 22. If additional relevant frequencies are to be analyzed, the process returns to step 110. If no additional frequencies are to be analyzed, the process is completed, and the results can be calculated by processor 22 and displayed to a system user via interface 24.

Figure 3:
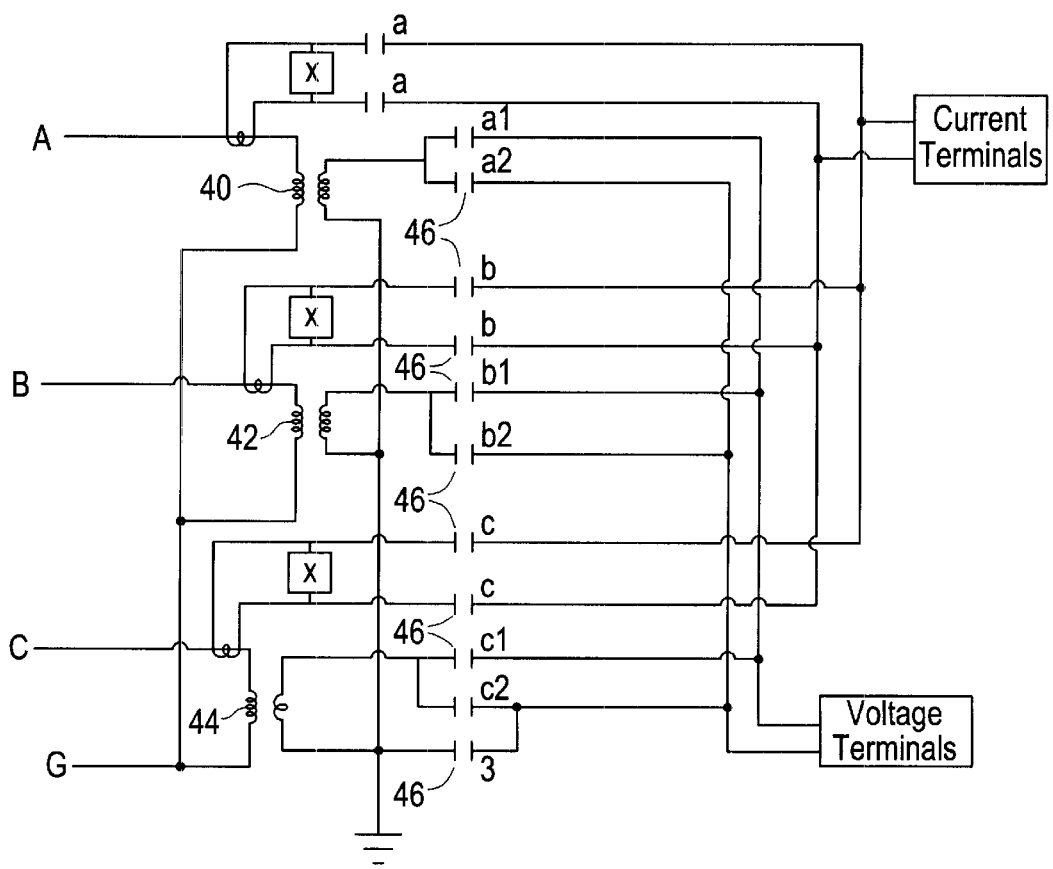
FIG. 3 is a block diagram of a three-phase configuration for connecting a meter such as the meter of FIG. 1 to a three-phase electrical system.

Referring now to FIG. 3, a block diagram of a three-phase application according to an aspect of the present invention. In this example, three step-up transformers 40, 42, and 44 are connected phase to ground as shown in FIG. 3. Current transformer over voltage protection is provided by elements X. Multiple two-pole contactors 46 are used to attach the voltage and current circuit of the apparatus to each of the three-phase transformers 40, 42, and 44. It will be appreciated that this arrangement allows for six measurements, three phase-phase and three phase-ground. These measurements can be input to both the current terminals and voltage terminals of the device of FIG. 1. The phase-phase measurements can be input to the processor 22 to determine the impedance of each phase, substantially as described with respect to FIGS. 1 and 2. Based on the impedance of each phase, and the phase-ground measurements, the total ground impedance can be determined by the processor 22. Using the three phase-phase voltages and the three phase-ground voltages, the fault currents can then be calculated using conventional circuit analysis techniques. The fault currents are preferably determined for all desired fault combinations, including one or more of the following: three-phase, phase-phase (3 results), phase-ground (3 results). If desired, the processor 22 can also be programmed to calculate positive, negative, and zero-sequence impedances.

In the arrangement of FIG. 3, only one pair of the switches 46 (e.g., a—a, b—b, or c—c) is closed at a time. For phase to ground measurements are desired, switch 46, labeled "g", is closed and one of the switches 46 (a1, b1, or c1) is closed. For phase-phase measurements, "g" is opened and switch combinations such as a1-b2, a1-c2, b1-c2, etc., are closed.

It will be appreciated that the instrument transformers, both current and voltage, have frequency responses which affect measurements. According to one aspect of the present invention, an automatic calibration function determines the frequency response of the transformers, and applies a correction to the results of the measurements. This function can be implemented in the manner shown in FIGS. 4 and 5.

Figure 4:
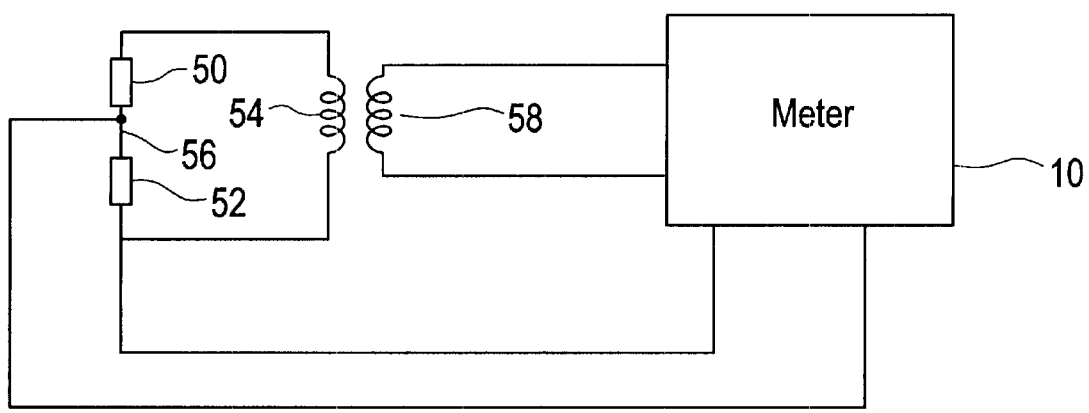
FIG. 4 is a block diagram of an automatic calibration configuration suitable for use with the voltage transformer of FIG. 1.

FIG. 4 shows a voltage transformer configuration for implementing the automatic calibration function. In this configuration, a voltage divider comprising resistances 50 and 52 is provided across the high voltage winding 54 of an output transformer. The voltage divider divides the voltage across the high voltage winding 54 of the output transformer. The divided voltage present at node 56, and the divided voltage and the high voltage winding 54 are provided to the meter (e.g., as in FIG. 1). Based on these inputs, and on the inputs from the low voltage winding 58, the processor 22 can determine the necessary correction. The meter can inject signals at a range of frequencies, substantially as described with respect to FIG. 2, and can process the results to generate and store internal ratio correction factor tables. The processor 22 can then consult the tables when making measurements to apply an appropriate correction.

Figure 5:
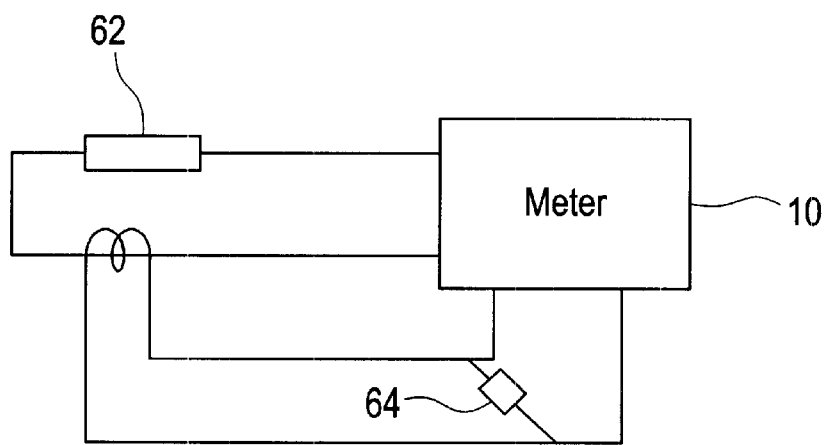
FIG. 5 is a block diagram of an automatic calibration configuration suitable for use with the current transformer of FIG. 1.

FIG. 5 shows a current transformer configuration for implementing automatic calibration. In this configuration, the current transformer output is provided, both directly and through a linear resistance 62, to the meter. The current transformer windings are also connected to the meter, substantially as described with respect to FIG. 1. A burden resistor 64 is preferably provided across the current transformer windings as shown in FIG. 5. The calibration function is performed automatically by the meter, under the control of processor 22, substantially as described with respect to FIG. 4.

The foregoing description includes many details, which should not be construed as limitations of the invention. Many of the described details can be varied without departing from the scope of the invention, as defined by the following claims and their legal equivalents.

What is claimed is:

1. A method for measuring an impedance of electrical distribution equipment at harmonic frequencies, comprising:

Automatically selecting a first frequency and one or more additional frequencies by scanning harmonic frequencies to be used for measurements, and selecting the harmonic frequencies which have an interference level below a threshold;

Applying a voltage at said first frequency to the electrical distribution equipment;

Measuring current through the electrical distribution equipment;

Calculating impedance using said measured current; and

Repeating said applying, measuring, and calculating for each of said one or more additional frequencies.

2. The method of claim 1, wherein the measured current is an RMS current, and wherein said step of calculating impedance includes dividing an RMS voltage by the measured RMS current.

3. The method of claim 1, wherein said step of calculating impedance includes determining phase angle between voltage and current, and determining resistance and inductance at each frequency.

4. The method of claim 3, further comprising steps of:

Checking data by performing a linear regression prior to said repeating; and

Continuing with said repeating if data meets a quality threshold, and terminating the method if the data does not meet the quality threshold.

5. The method of claim 1, further comprising the steps of:

Measuring line voltage; and

Calculating available short circuit amperage from the measured line voltage.

6. A method for measuring an impedance of electrical distribution equipment at harmonic frequencies, comprising:

automatically selecting a first frequency and one or more additional frequencies by scanning harmonic frequencies to be used for measurements, and selecting the harmonic frequencies which have an interference level below a threshold;

applying a voltage at said first frequency to the electrical distribution equipment;

digitally sampling current through the electrical distribution equipment;

calculating the impedance using said digitally sampled current;

repeating said applying, measuring, and calculating for each of said one or more additional frequencies if said data meets a quality threshold; and terminating the method if the data does not meet the quality threshold.

7. The method of claim 6, wherein said scanning harmonic frequencies includes scanning voltage and current harmonics.

8. The method of claim 6, further including:

determining a frequency response of a first transformer for said digitally sampling current; and applying a correction to said digitally sampled current in response to said frequency response.

9. The method of claim 6, further including:

determining a frequency response of a first transformer for said applying said voltage; and applying a correction to said voltage in response to said frequency response.

* * * * *